United States Patent [19]

Filippi et al.

[11] Patent Number: 6,037,795
[45] Date of Patent: Mar. 14, 2000

[54] MULTIPLE DEVICE TEST LAYOUT

[75] Inventors: Ronald G. Filippi, Wappingers Falls; James J. Poulin, Poughquag; Robert D. Raviart, Poughkeepsie; Kenneth P. Rodbell, Poughquag; Richard G. Smith, Poughkeepsie, all of N.Y.; Timothy D. Sullivan, Underhill, Vt.; Alexander J. Swinton, Hopewell Junction, N.Y.

[73] Assignee: International Business Machines Corporation, Armonk, N.Y.

[21] Appl. No.: 08/938,871

[22] Filed: Sep. 26, 1997

[51] Int. Cl.[7] .................................................. G01R 31/28
[52] U.S. Cl. ........................ 324/763; 324/760; 324/765; 324/158.1
[58] Field of Search .................................. 324/760, 763, 324/765, 158.1

[56] References Cited

U.S. PATENT DOCUMENTS

| | | | |
|---|---|---|---|
| 5,053,700 | 10/1991 | Parrish | 324/158 R |
| 5,357,193 | 10/1994 | Tanaka et al. | 324/158.1 |
| 5,514,974 | 5/1996 | Bouldin | 324/763 |
| 5,598,009 | 1/1997 | Bui | 324/765 X |
| 5,818,252 | 10/1998 | Fullman et al. | 324/765 |

FOREIGN PATENT DOCUMENTS

| | | |
|---|---|---|
| 58-182237 | 10/1983 | Japan . |
| 62-235744 | 10/1987 | Japan . |
| 3-269377 | 11/1991 | Japan . |

OTHER PUBLICATIONS

R.H. Koch et al., "1/f Noise and Grain–Boundary Diffusion in Aluminum and Aluminum Alloys," Phys. Rev. Lett., vol. 55(22), 2487–90 (Nov. 1985).

John G.J. Chern et al., "Electromigration in Al/Si Contacts–Induced Open–Circuit Failure," IEEE Transactions on Electron Devices, vol. ED–33(9), 1256–62 (Sep. 1986).

C–K. Hu et al., "Electromigration in Al/W and Al(Cu)/W Interconnect Structures," Mat. Res. Soc'y Symp. Proc., vol. 225, 99–105 (1991) (Month Unavailable).

C–K. Hu et al., "Electromigration in Al(Cu) Two–Level Structures: Effect of Cu and Kinetics of Damage Formation," J. Appl. Phys. 74(2), 969–78 (Jul. 1993).

R.G. Filippi et al., "The Effect of Copper Concentration on the Electromigration Lifetime of Layered Aluminum–Copper (Ti–AlCu–Ti) Metallurgy With Tungsten Diffusion Barriers," VMIC Conf. Jun. 9–10, 1992, 359–65 (Jun. 1992).

B.N. Agarwala et al., "Dependence of Electromigration–Induced Failure Time on Length and Width of Aluminum Thin–Film Conductors," J. Appl. Phys., vol. 41(10), 3954–60 (Sep. 1970).

J.R. Black, Electromigration of Al–Si Alloy Films, 16th Annual Proceedings of Reliability Physics, 233–40 (1978) (Month Unavailable).

H.P. Longworth et al., "Experimental Study of Electromigration in Bicrystal Aluminum Lines," Appl. Phys. Lett. 60(18), 2219–21 (Mar. 1992).

R.G. Filippi et al., "Paradoxical Predictions and a Minimum Failure Time in Electromigration," Appl. Phys. Lett. 66(15), 1897–99 (Apr. 1995).

B.J. Root et al., "Wafer Level Electromigration Tests For Production Monitoring," 23rd Annual Proceedings of Reliability Physics, 100–07 (1985) (Month Unavailable).

C.C. Hong et al., "Breakdown Energy of Metal (BEM)—A New Technique for Monitoring Metallization Reliability at Wafer Level," 23rd Annual Proceedings of Reliability Physics, 108–14 (1985) (Month Unavailable).

*Primary Examiner*—Glenn W. Brown
*Attorney, Agent, or Firm*—Ratner & Prestia; Tiffany L. Townsend

[57] ABSTRACT

A test layout increases the sample size of electromigration experiments. Through pad sharing, the number of structures tested can be increased, allowing hundreds of identical structures to be tested in a single high temperature oven door.

20 Claims, 8 Drawing Sheets

MULTIPLE DEVICE TEST LAYOUT

FIELD OF THE INVENTION

This invention relates generally to a layout for testing a large sample of electronic structures, and more specifically to the testing of electromigration failures of interconnections on integrated circuits.

BACKGROUND OF THE INVENTION

Integrated Circuits (ICs) rely on aluminum (Al) based interconnections to carry current to and from active devices (i.e., MOSFETS and Bipolar Transistors). Interconnections of copper (Cu) and gold (Au) have also been used and continue to be used for a limited number of applications. The reliability of these interconnections is generally limited by a phenomenon known as electromigration. Electromigration is the motion of atoms in a conductor due to the passage of current. It is basically a diffusional phenomenon with an applied electric field appearing to act as the driving force.

There are two mechanisms by which electromigration can lead to IC failure. In both cases, a net amount of Al migrates in the direction of the electron flow. In the first electromigration failure mechanism, a void is left behind at the negative end of the interconnection. As noted by R. H. Koch et al., 1/f *Noise and Grain-Boundary Diffusion in Aluminum and Aluminum Alloys*, Phys. Rev. Lett., Vol. 55(22), 2487–90 (1985), and by John G. J. Chern et al., *Electromigration in Al/Si Contacts-Induced Open-Circuit Failure*, IEEE Transactions on Electron Devices, Vol. ED-33(9), 1256–62 (1986), as the void grows due to continued Al mass transport, the resistance of the interconnection increases until an open circuit failure occurs. Single-layered metallizations typically show little or no resistance increase before failing catastrophically. In the case of multi-layered metallizations, a resistance increase is usually observed before catastrophic failure occurs. It has been shown that the resistance increase is caused by the depletion of Al. C-K. Hu et al., *Electromigration in Al/W and Al(Cu)/W Interconnect Structures*, Mat. Res. Soc'y Symp. Proc., Vol. 225, 99–105 (1991); C-K. Hu et al., *Electromigration in Al(Cu) Two-Level Structures: Effect of Cu and Kinetics of Damage Formation*, J. Appl. Phys. 74(2), 969–78 (1993).

In the second electromigration failure mechanism, an accumulation of Al occurs at the positive end of the interconnection. This accumulation causes pressure to be exerted on the surrounding insulator. As the pressure increases due to continued mass transport, cracks form in the insulator. The Al extrudes into the cracks in the insulator, causing a short circuit failure when the extruded material reaches an adjacent interconnection.

IC failure due to electromigration can only occur if there is a flux divergence. In thin-film conductors, flux divergences can be caused by both non-uniform structure and temperature gradients. Structural non-uniformities include grain boundaries, variation in grain size, and the presence of diffusion barriers. The interlevel tungsten (W) via used in Very Large Scale Integration (VLSI) and Ultra Large Scale Integration (ULSI) has introduced a barrier to Cu and Al diffusion between wiring levels. The presence of the W via has eliminated the so-called reservoir effect, thereby reducing the electromigration lifetime of multi-level test structures with W vias as compared to single level test structures C-K. Hu et al. *Electromigration in Al/W and Al(Cu)/W Interconnect Structures*, Mat. Res. Soc'y Symp. Proc., Vol. 225, 99–105 (1991); C-K. Hu et al., *Electromigration in Al(Cu) Two-Level Structures: Effect of Cu and Kinetics of Damage Formation*, J. App. Phys. 74(2), 969–78 (1993); R. G. Filippi et al., *The Effect of Copper Concentration on the Electromigration Lifetime of Layered Aluminum-Copper (Ti—AlCu—Ti) Metallurgy With Tungsten Diffusion Barriers*, VMIC Conf. Jun. 9–12, 1992, 359–65 (1992).

Traditionally, electromigration lifetimes have been described using a two-parameter log-normal distribution $$Z = \frac{\ln(t) - \ln(t_{50})}{\sigma} \quad (1)$$

where Z is the inverse normal cumulative distribution function (CDF), t is the failure time, $t_{50}$ is the median time to failure, and $\sigma$ is the shape parameter that measures the breadth in time during which failures occur. When plotted on log-normal probability paper, the failure times usually exhibit a good fit to a straight line. B. N. Agarwala et al., *Dependence of Electromigration-Induced Failure Time on Length and Width of Aluminum Thin-Film Conductors*, J. Appl. Phys., Vol. 41(10), 3954–60 (1970); J. R. Black, *Electromigration of Al—Si Alloy Films*, 16th Annual Proceedings of Reliability Physics, 233–40 (1978); H. P. Longworth et al., *Experimental Study of Electromigration in Bicrystal Aluminum Lines*, Appl. Phys. Lett. 60(18), 2219–21 (1992).

Recently, it was shown that the two-parameter log-normal distribution does not accurately describe early electromigration failures, resulting in paradoxical lifetime predictions. R. G. Filippi et al., *Paradoxical Predictions and a Minimum Failure Time in Electromigration*, Appl. Phys. Lett. 66(15), 1897–99 (1995)(hereafter "Paradoxical Predictions"). The apparent paradox was resolved by testing a large sample size and fitting the failure data to the three-parameter log-normal distribution $$Z = \frac{\ln(t - t_0) - \ln(t_{50} - t_0)}{\sigma} \quad (2)$$

where $t_0$ is the incubation time or the minimum time required before failure can occur.

Figure 1:
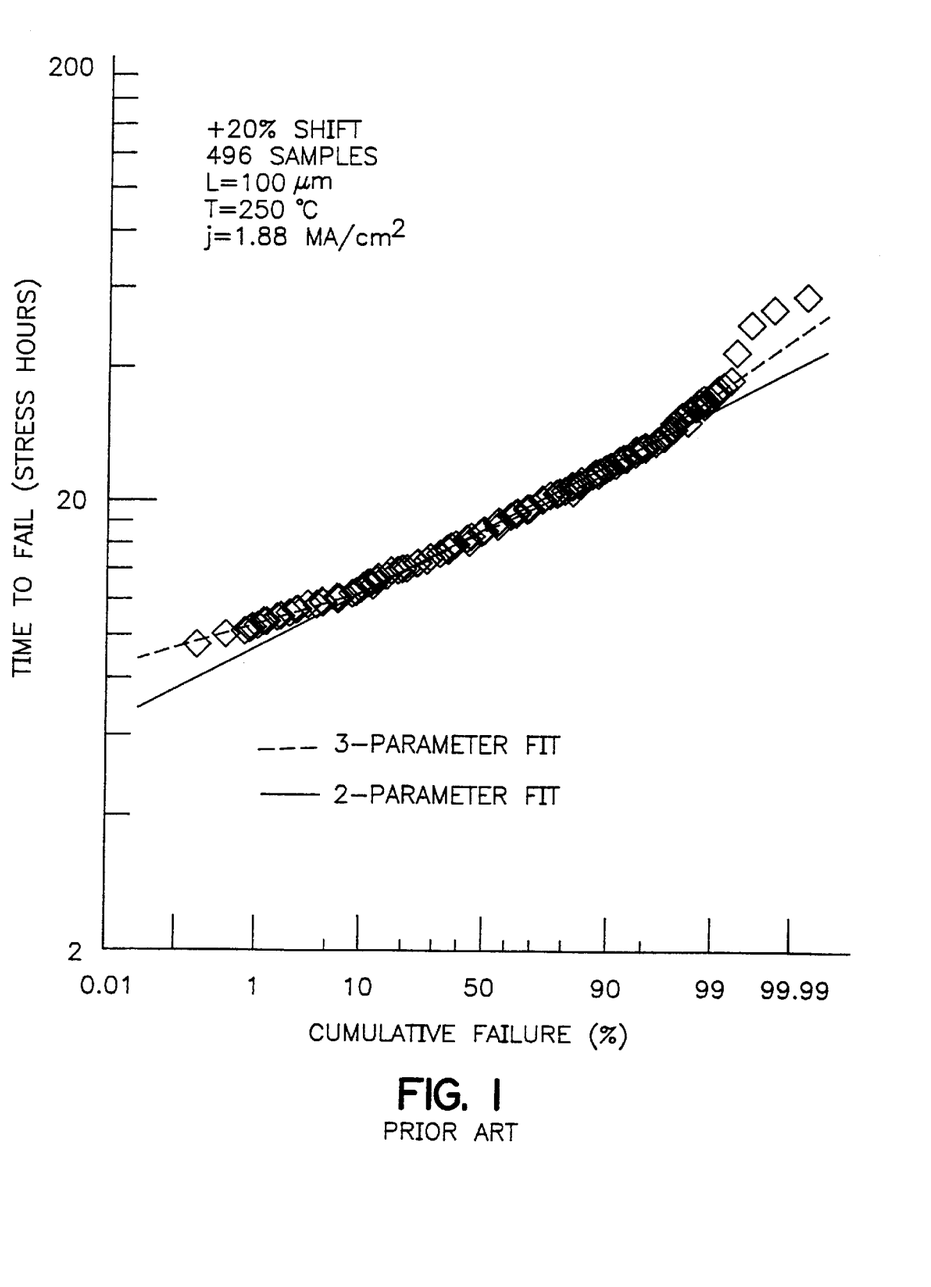
FIG. 1 is a log-normal CDF plot of time to electromigration failure data and the two-parameter and three-parameter fits to the data.

FIG. 1 (taken from "Paradoxical Predictions") shows a log-normal CDF plot of the time to failure for 496 electromigration test samples. The samples were two-level structures having tungsten (W) stud-vias and titanium-aluminum copper-titanium (Ti—AlCu—Ti) metallization. The test conditions were 250° C. and 1.88 MA/cm$^2$, and the failure criterion was a +20% shift in resistance. The solid line represents the least-squares regression fit according to Equation (1) above while the dashed curve represents the least-squares regression fit according to Equation (2) above. Both the two- and three-parameter models reasonably fit the electromigration data between 5% and 95% cumulative failure. Clearly, the three-parameter model fits the data better than the two-parameter model at low (<5%) cumulative failure.

Figure 2:
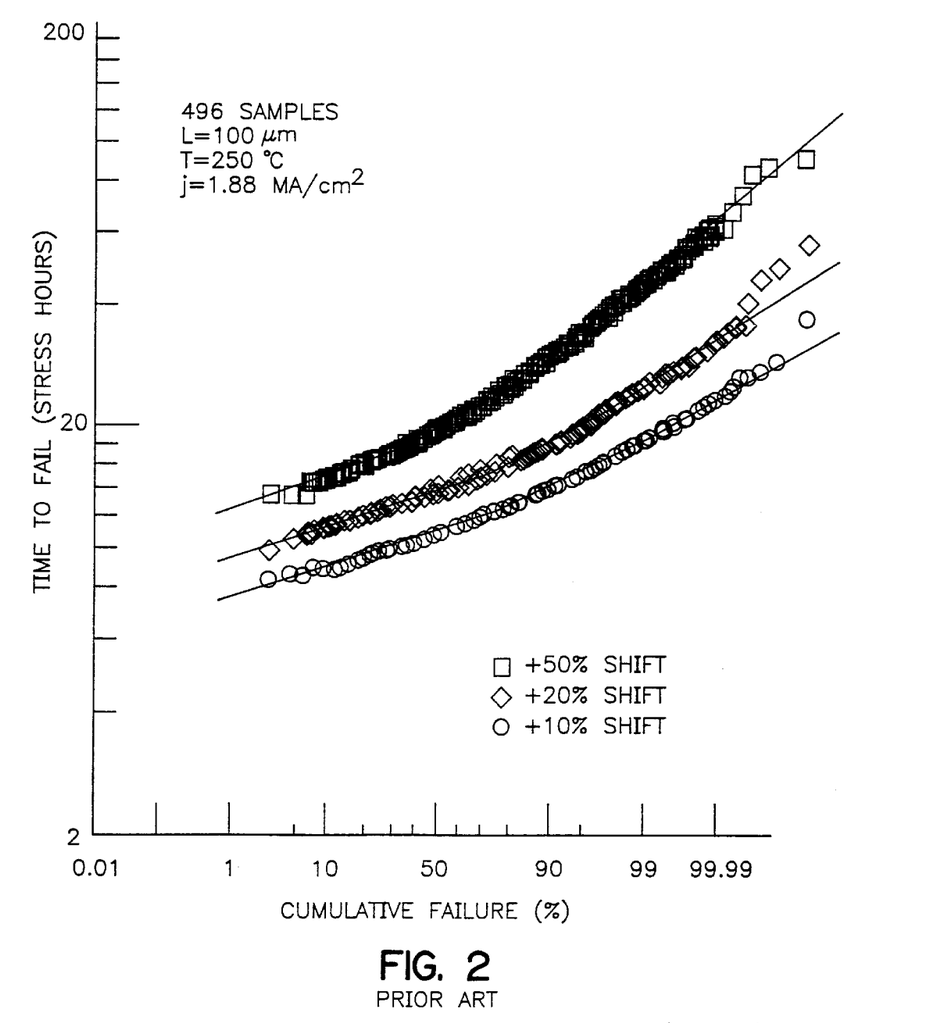
FIG. 2 is a log-normal CDF plot of time to electromigration failure data for three different failure criteria and the corresponding three-parameter model fits to the data.

FIG. 2 (taken from "Paradoxical Predictions") shows a log-normal CDF plot of the time to failure for 496 electromigration samples. Three different plots for three different failure criteria (10%, 20%, and 50% increase in resistance of test sample) are shown. Fitting the data for each failure criterion to Equation (2) results in $t_0$ values of 4.70, 6.78, and 9.10 hours for failure criteria of +10%, +20%, and +50%, respectively. The minimum time required before failure can occur ($t_0$) increases as the maximum allowed resistance change increases.

Evidence of a minimum time to failure has important implications for determining current densities at chip operating conditions. The results illustrated in FIGS. 1 and 2 suggest that the two-parameter log-normal distribution may overestimate the electromigration susceptibility of IC chips. If there is a minimum time required for electromigration failure, as the data indicate, then allowable operating current densities may be underestimated by using the two-parameter log-normal approach. This may impact the performance of certain IC chips and demonstrates the importance of testing a large sample size in electromigration experiments. For example, by using the three-parameter fit, circuit designers may be able to use higher currents while achieving the same reliability.

Conventional electromigration experiments are conducted at the chip level. Sample preparation is quite extensive for chip level experiments. Preparation involves dicing wafers into chips, mounting the chips onto substrates suitable for high temperature testing, and wire bonding from the test structure pads to the appropriate pins on the substrates. Usually, only one chip is mounted onto a single substrate, and only one or two test structures are wire bonded and stressed.

Wafer-level electromigration tests, such as the Standard Wafer-Level Electromigration Accelerated Test (SWEAT) as described by B. J. Root et al., *Wafer Level Electromigration Tests For Production Monitoring,* 23rd Annual Proceedings of Reliability Physics, 100–07 (1985), and the Breakdown Energy of Metal (BEM) Test as described by C. C. Hong et al., *Breakdown Energy of Metal (BEM)—A New Technique for Monitoring Metallization Reliability at Wafer Level,* 23rd Annual Proceedings of Reliability Physics, 108–14 (1985), avoid the sample preparation problems of conventional electromigration experiments. Wafer-level electromigration tests are conducted, however, at very high current densities (usually greater than 10 MA/cm$^2$). Although sample preparation is extensive, chip-level testing is preferred for reliability measurements because it is difficult to correlate the results of tests at high current densities to actual operating conditions.

While the typical sample size for conventional electromigration experiments is less than 50, recent results suggest that larger sample sizes are necessary to accurately extrapolate stress results to operating conditions. R. G. Filippi et al., *Paradoxical Predictions and a Minimum Failure Time in Electromigration,* Appl. Phys. Lett. 66(15), 1897–99 (1995). Testing sample sizes much greater than 100 using conventional electromigration experiments is not practical considering the sample preparation time as well as the number of chips required for testing. Therefore, a need exists for testing a larger number of structures on a much smaller number of chips.

To overcome the shortcomings of conventional electromigration experiments, a new test layout is provided. An object of the present invention is to provide an improved test layout for detecting device failures by utilizing pad sharing. A related object is for the test layout to detect elecromigration failures caused by the first electromigration failure mechanism. Another object is for the test layout to detect elecromigration failures caused by the second electromigration failure mechanism. A further object is for the test layout to concurrently detect electromigration failures caused by both the first and second electromigration failure mechanisms.

SUMMARY OF THE INVENTION

To achieve these and other objects, and in view of its purposes, the present invention provides a test layout utilizing pad sharing to maximize the number of devices tested. Each device to be tested has at least two terminals. An individual I+ pad is coupled to the first terminal of each device and one or more common I− pads are coupled to the second terminal of each device. Failure of a device can be detected by monitoring changes in the resistance or other operating parameters of the device during testing or by detecting extrusion from the device into a surrounding insulator.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 3:
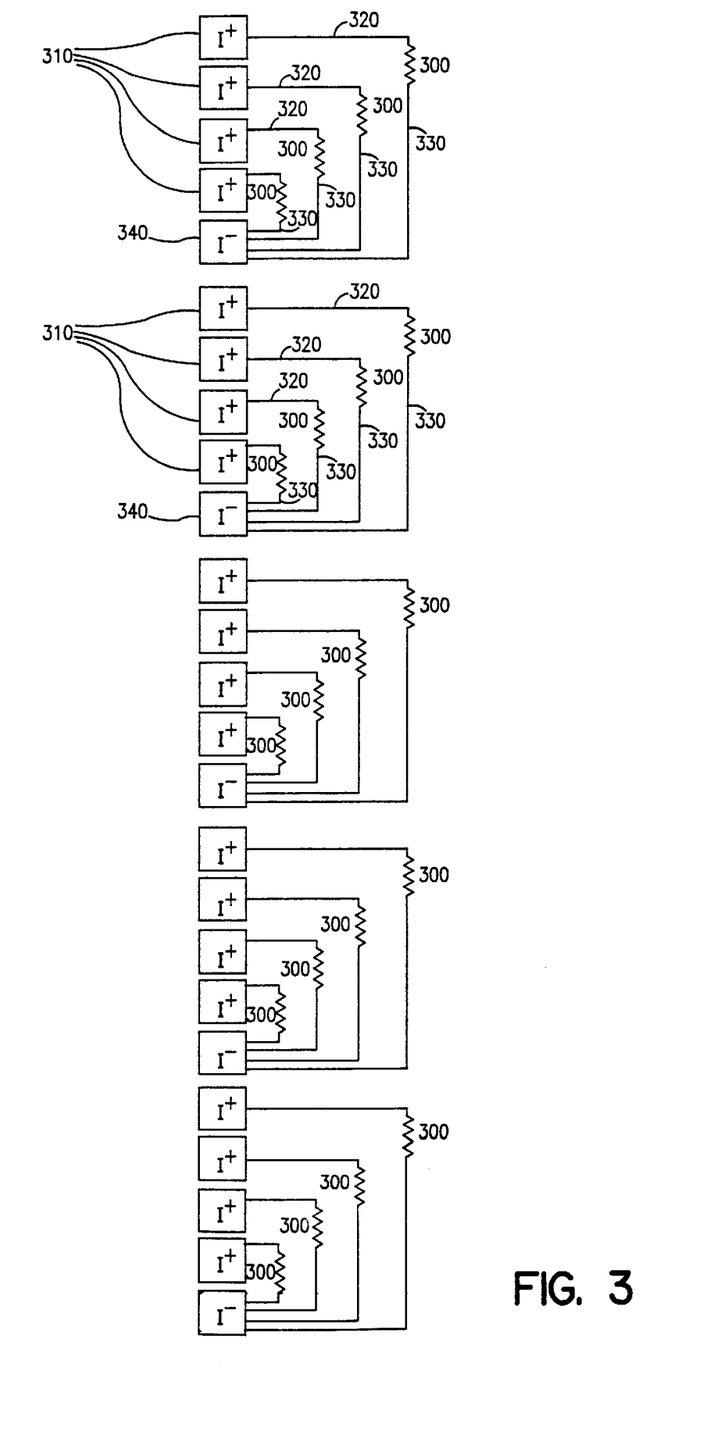
FIG. 3 is a schematic diagram of an exemplary embodiment according to the present invention.

Referring now to the drawing, wherein like reference numerals refer to like elements throughout, FIG. 3 shows a test layout according to a first embodiment of the invention. The test layout makes use of pad sharing to maximize the number of devices which can be tested for a given pad configuration, thus reducing the number of chips needed to accomplish testing.

Each device 300 to be tested is a multi-terminal device. An individual I+ pad 310 is coupled to a first terminal of a device 300 by a line 320. A second terminal of each device is coupled to a common I− pad 340 by a line 330. The connectors 320 and 330 are designed to be robust enough to ensure they do not fail before the devices 300 fail.

For electromigration testing, for example, the device 300 could be a single- or multi-level interconnection that could be used between active devices on an integrated circuit. For electromigration testing, the lines 320 and 330 can be made robust by making them extra wide. For example, where a device 300 for electromigration testing is one micron wide, the lines 320, 330 leading to and away from the device 300 may be twenty microns wide so they are much less susceptible to failure than the actual device. Note that a very short device in electromigration testing may be subject to the short length effect resulting in a device 300 that will not fail regardless of current density.

The test layout of FIG. 3 could be used to test devices 300 for electromigration failure by providing a constant source of current (not shown) into the I+ pad 310 of each device 300. The electromigration of a device 300 will result in an increase in resistance of the device. The resistance of each device 300 can be monitored by measuring the voltage difference between the device's I+ pad 310 and its corresponding common I- pad 340. The device 300 is deemed to have failed after a specified percentage increase in the resistance of the device. The use of the test layout of FIG. 3 as described above provides a two-point measurement capability.

Figure 4:
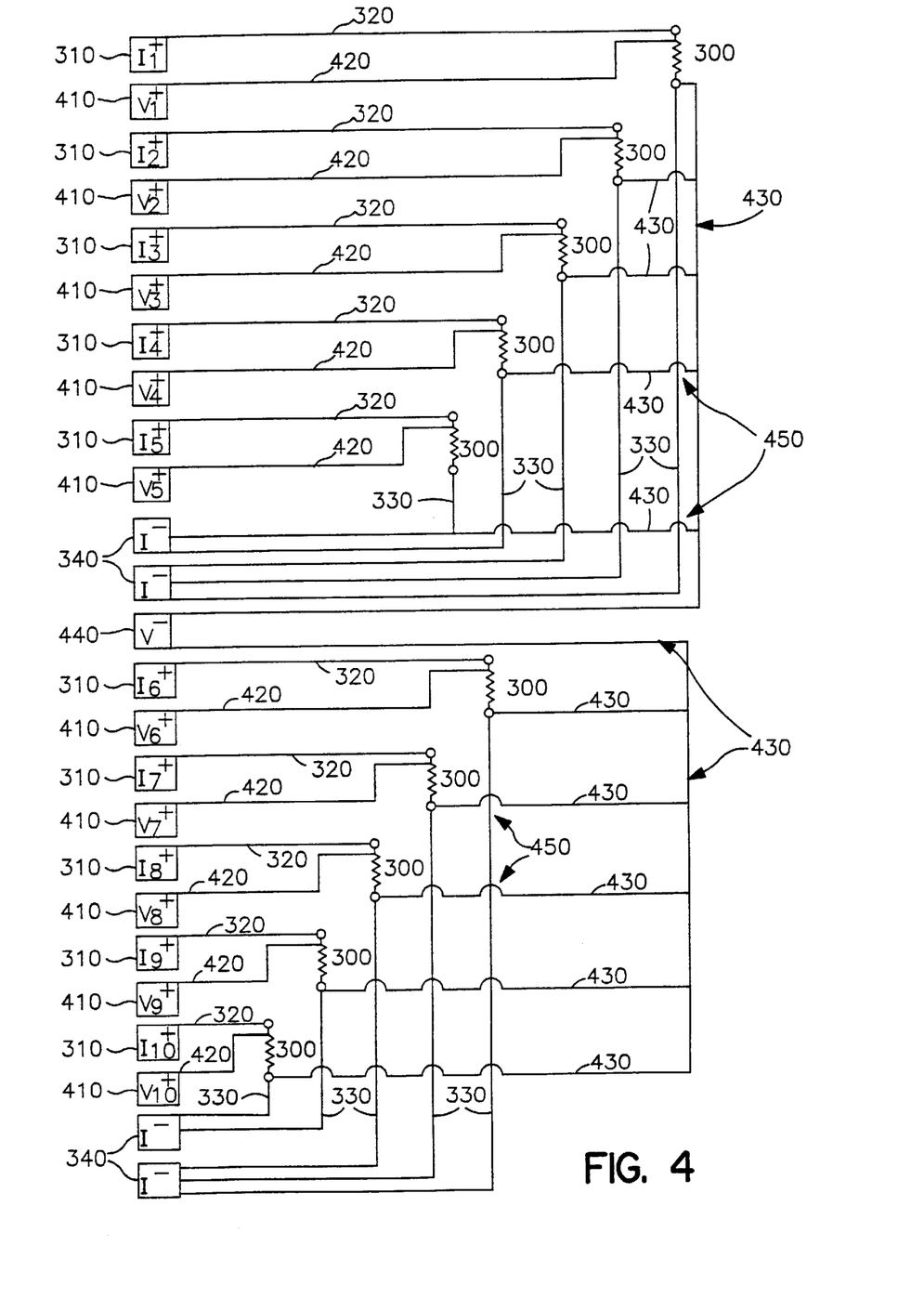
FIG. 4 is a schematic diagram of an exemplary embodiment according to the present invention.

The circuit of FIG. 3 shows four devices 300 having a common I- pad 340. This is limited only by the requirements of a particular test. For example, in electromigration testing, there is a tradeoff between the number of devices 300 that can be connected to a single I- pad 340 and the extent to which a line leading to the I- pad 340 needs to be robust. As shown in FIG. 4, five devices 300 are coupled to two I- pads 340 as may be required in cases where the lines to the I- pads 340 are not robust enough to use a single I- pad.

FIG. 4 is a schematic diagram showing ten devices 300 incorporated into the test layout of FIG. 3. In addition to the I+ pads 310 and the I- pads 340 of FIG. 3, the circuit of FIG. 4 includes V+ pads 410 and a V- pad 440. Although the circuit of FIG. 4 shows one V- pad 440, multiple V- pads 440 can be used to accommodate the requirements of a particular test. An individual V+ pad 410 is coupled by a line 420 to the same end of each device 300 to which the I+ pad 310 is connected. A common V- pad 440 is connected by a line 430 to the same end of the device 300 as the I- pads 340 are connected. The conductors of lines 330 and 430 are designed with interlevel vias or studs, where necessary, to ensure no electrical contact between conductors on the same metal level in regions 450.

The schematic of FIG. 4 can be used to detect electromigration failures, for example, of the devices 300. In an electromigration failure test, the devices 300 would be single or multi-level interconnections of Al for example. The test could be performed by providing a constant source of current into the I+ pad 310. The electromigration of an interconnection increases the resistance of the interconnection, thereby increasing the voltage across the interconnection when a constant current is applied.

The voltage across each interconnection is measured between the corresponding V+ pad 410 and V- pad 440. By measuring the voltage at the beginning of the test and monitoring the voltage, the increase in resistance of each interconnection can be calculated. Once the resistance is found to increase a certain set percentage beyond the initial resistance value, the interconnection is deemed to have failed. The particular percentage increase in resistance to deem a device as having failed is not fixed. It can be set to suit a particular test or particular operating conditions under which a device is to be used.

The circuit in FIG. 4 allows for a 4-point measurement of device 300. Pad sharing permits an accurate 4-point measurement for each device while minimizing the work needed to wire bond a chip to a substrate for testing. Additional savings can be realized if the accuracy of a 4-point measurement is not required. For example, the V- pads 440 can be eliminated if only a 3-point measurement is required for a particular test, thus further reducing the number of pads needed or allowing an increased number of devices 300 to be tested. In the case where the V- pads 440 are eliminated, the I- pads 340 can also be used for voltage sensing. This 3-point measurement may not provide as accurate a voltage measurement across the device 300 as a 4-point measurement would.

The test of the devices 300 of FIG. 4 was described above with the use of a constant current source (not shown). The devices 300 can be driven by alternate sources as known to those skilled in the art. For example, FIG. 5 shows an example of an external circuit 510 used in combination with the test layout of FIG. 4.

Figure 5:
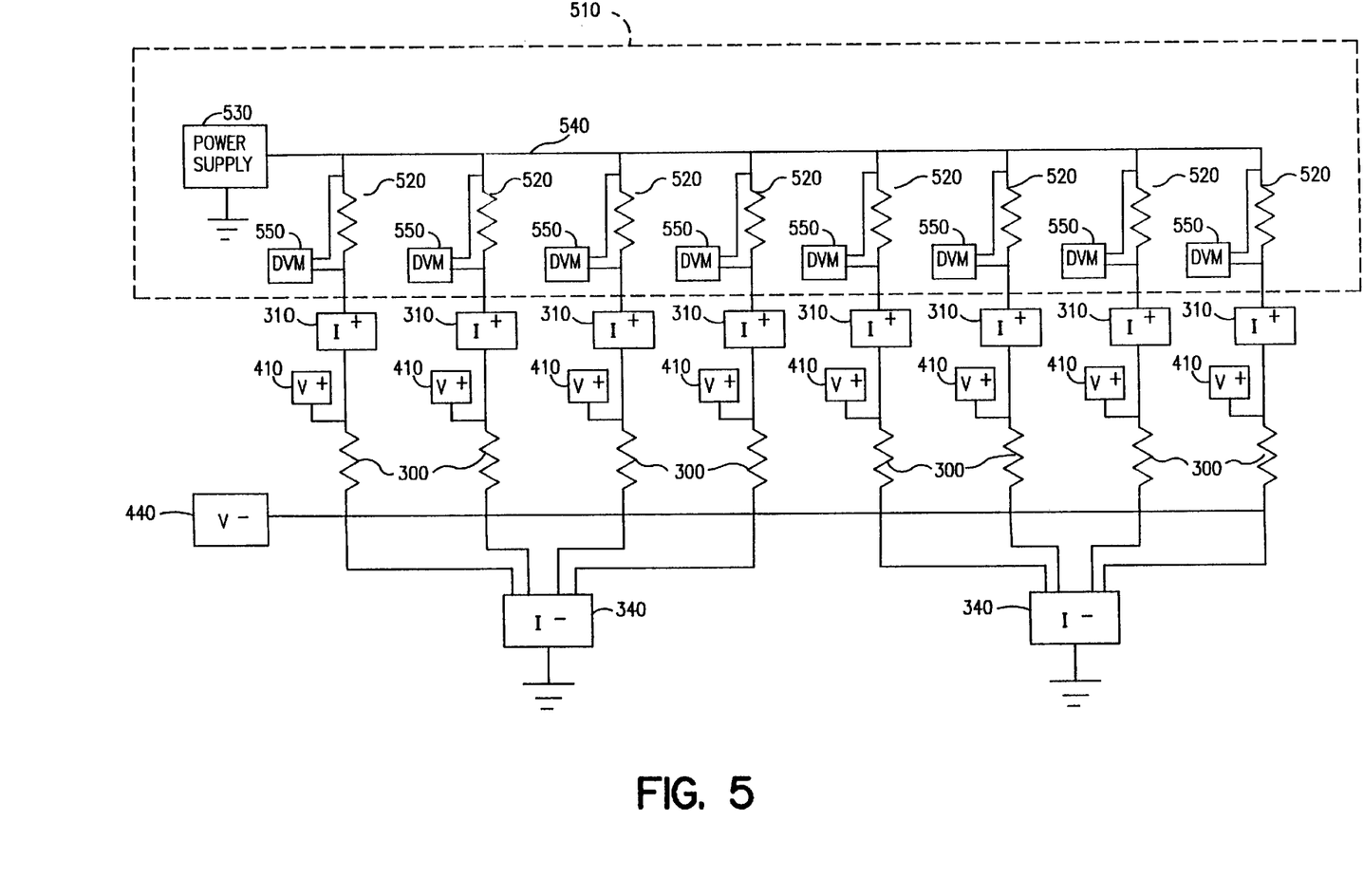
FIG. 5 is a schematic diagram of an external circuit that may be used with an embodiment of the present invention.

In FIG. 5, the power supply 530 of the external circuit 510 provides a supply voltage via line 540 to one end of each load resistor 520. The other end of each load resistor 520 is coupled to a I+ pad 310 of a test layout as described in FIG. 4. A digital volt meter (DVM) 550 can be used to measure the voltage across a load resistor 520 to initially set the current flow into the I+ pad 310. Once the initial current is set by the external circuit 510, the voltage across the device 300 is monitored during testing by measuring the voltage between the corresponding V+ pad 410 and V- pad 440.

Figure 6:
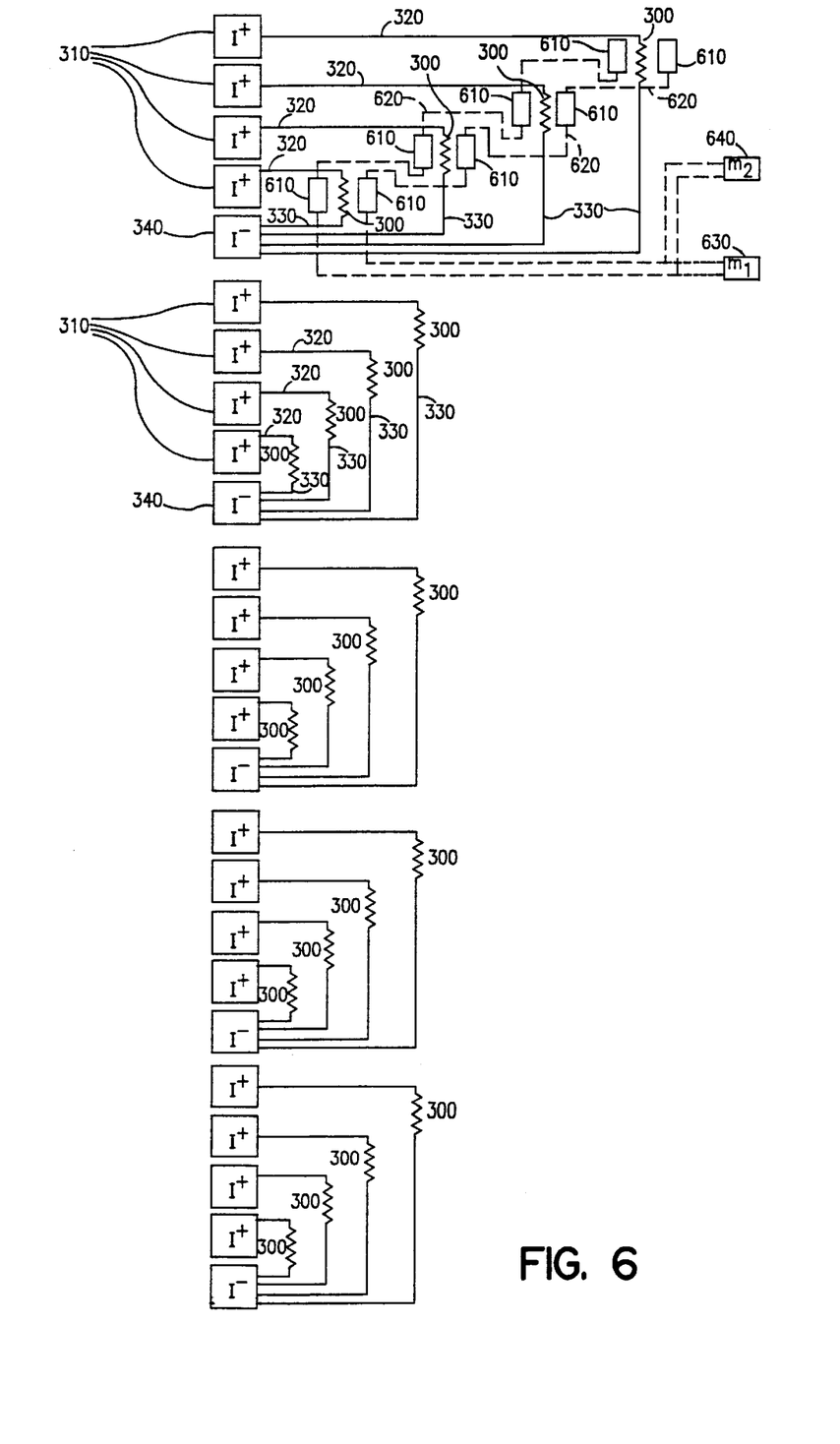
FIG. 6 is a schematic diagram of an exemplary embodiment for detecting extrusion failures according to the present invention.
Figure 7:
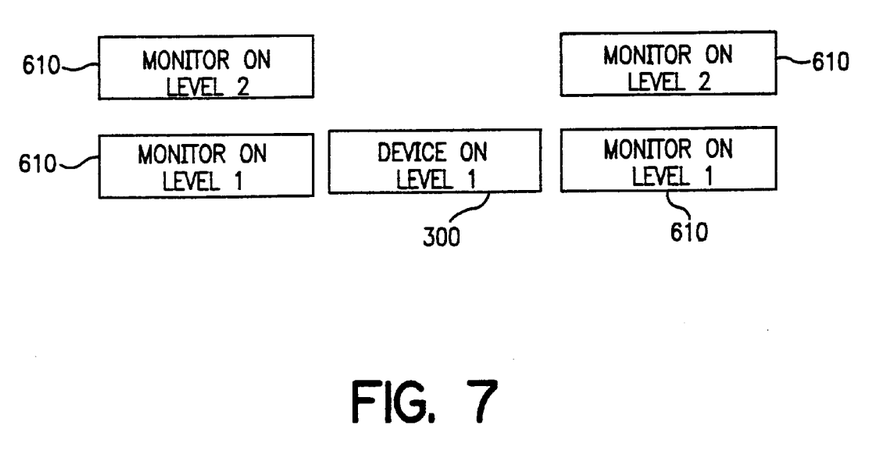
FIG. 7 is a diagram depicting an example of the placement of extrusion monitors of the embodiment of FIG. 6.

FIG. 6 shows a way to test the device 300. In addition to the I+ pads 310 and the I- pads 340 of FIG. 3, FIG. 6 includes extrusion monitors 610 to detect electrical shorts between the devices 300 and other circuit components (not shown). The extrusion monitors 610 can be located on the same level as a device 300, on a different level, or both. FIG. 7 shows a cross section of a device 300 and extrusion monitors 610 on multiple levels which allows both lateral and vertical extrusion type failures to be detected.

The extrusion monitors 610 on a single layer are connected in series to one or more common M pads 630, 640. In FIG. 6, the extrusion monitors on a same level as the device 300 are shown connected in series to pad M1 630. Extrusion monitors (not shown) on a different level than that of the devices 300 are similarly connected in series to pad M2 640. Which particular device has an extrusion type failure can be determined by monitoring the leakage current from the corresponding I+ pad to the M pad 630, 640.

The circuit of FIG. 6 can be used to detect an electromigration failure due to the second electromigration failure mechanism described above. When enough current (sourced for example by an external circuit as in FIG. 5) to induce electromigration is introduced into the device 300 through the I+ pad 310, the device 300 may begin to extrude into the surrounding insulator. The device 300 is deemed to have failed once it has extruded to the extent that a leakage current from the device 300 into the extrusion monitor 610 exceeds a predetermined limit. A current sensor (not shown) coupled to M pad 630, 640 will detect such leakage, thereby detecting when an extrusion-type electromigration failure of device 300 has occurred. Which particular device 300 has failed is determined by detecting leakage current from a particular I+ pad of that device to an M pad 630, 640.

Figure 8:
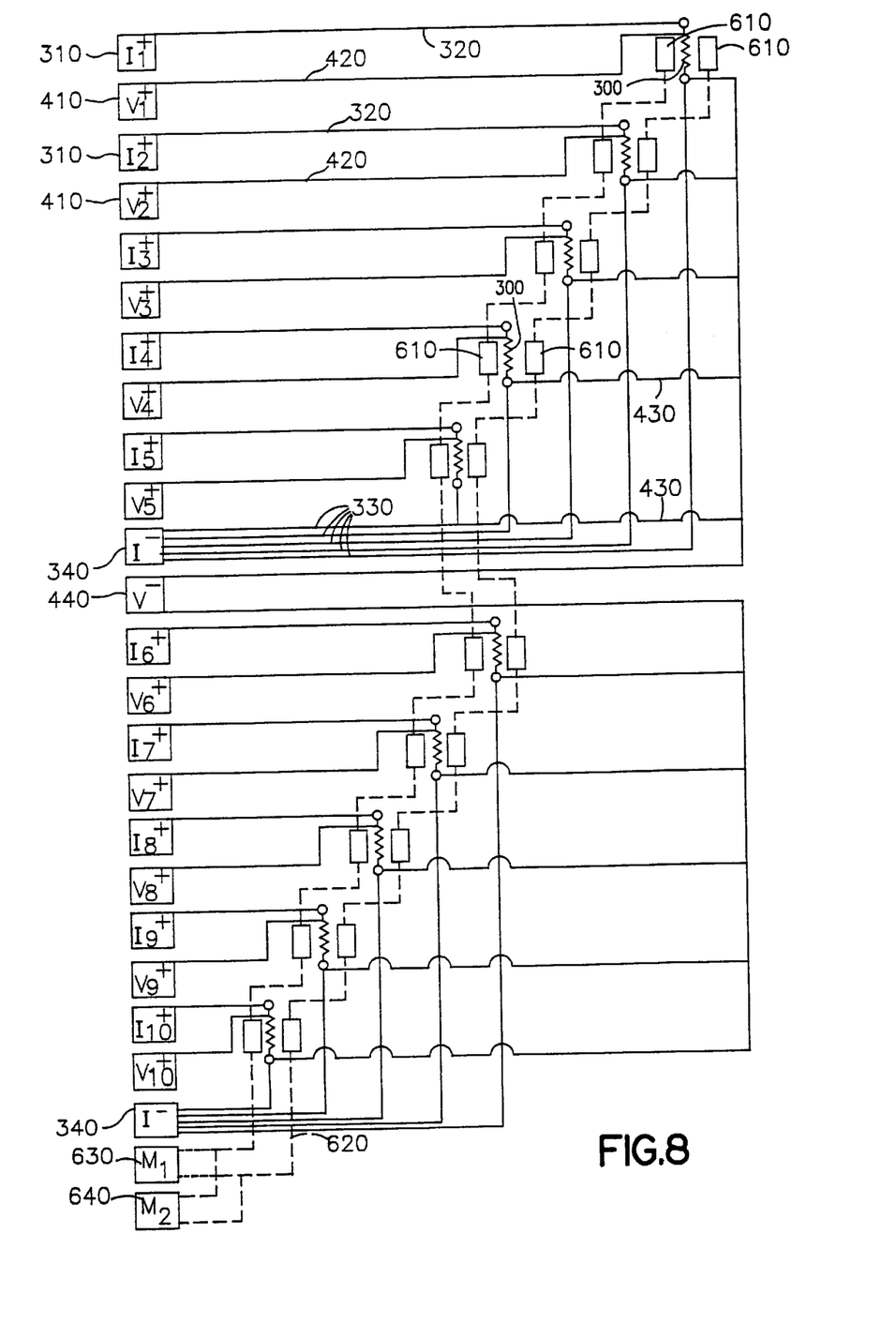
FIG. 8 is a preferred embodiment of the present invention.

FIG. 8 is a schematic of a preferred embodiment of the invention capable of detecting both electromigration failure mechanisms of a device 300. The circuit of FIG. 8 combines the I+ pads 310, I- pads 340, V+ pads 410, and V- pads 440 which can be used to detect the first electromigration failure mechanism with the extrusion monitors 610 and M pads 630, 640 to detect the second electromigration failure mechanism. The failure detection mechanism is similar to that described above in the description of FIGS. 4 and 6.

Although the described embodiments of the invention show a 1×25 pad array comprised of I+ pads 310 and I- pads 340, the invention can easily be modified to accommodate other pad arrays. Although the invention as described in the preferred embodiments is intended to maximize the number of test structures for conventional electromigration testing, the test layout of the invention could be readily utilized for wafer-level electromigration tests, such as SWEAT and BEM. The invention is suitable for use with all identical devices 300, all different devices, or some identical and some different devices.

The invention utilizes pad sharing, thus more than doubling the available structures in a given array. This unique arrangement and test methodology allows hundreds of identical structures to be tested in a single high-temperature oven door. Those skilled in the art could apply the teachings of this invention to increase the sample size when conducting tests other than electromigration testing such as: resistance measurements during temperature-humidity or temperature-biased humidity life stresses; resistance measurements during stress-induced voiding experiments; and leakage current measurements during Time Dependent Dielectric Breakdown (TDDB) experiments.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A test layout for detecting electromigration in conductive interconnects comprising:
    a plurality of conductive interconnects, each having at least a first terminal and a second terminal;
    an individual I+ pad for receiving a test signal coupled to the first terminal of each of the plurality of conductive interconnects;
    at least one common I− pad for receiving the test signal coupled to the second terminal of each of the plurality of conductive interconnects; and
    detecting means coupled to at least one of the first and second terminals of each of the plurality of conductive interconnects for detecting electromigration in the plurality of conductive interconnects in response to the test signal.

2. The test layout according to claim 1, wherein the detecting means comprises:
    an individual V+ pad coupled to the first terminal of each of the plurality of conductive interconnects; and
    at least one common V− pad coupled to the second terminal of each of the plurality of conductive interconnects.

3. The test layout according to claim 1, wherein the detecting means comprises:
    at least one monitor adjacent to one of the plurality of conductive interconnects; and
    at least one common M pad coupled to the at least one monitor,
    wherein leakage current from the one of the plurality of conductive interconnects to the at least one monitor is detected.

4. A test layout according to claim 3, further comprising a substrate, a first metallization layer formed on the substrate, and a second metallization layer formed on the substrate, and
    wherein the one of the plurality of conductive interconnects is on one of the first metallization layer and the second metallization layer and the at least one monitor is on one of the first metallization layer and the second metallization layer, and wherein lateral and vertical extrusion of the one of the plurality of conductive interconnects results in a leakage current from the one of the plurality of conductive interconnects to the at least one monitor.

5. A test layout according to claim 1, wherein each of the plurality of conductive interconnects is one of a single-level and a multi-level interconnection structure on an integrated circuit.

6. A test layout according to claim 1, wherein each of the plurality of conductive interconnects is adapted to fail before any other component of the test layout.

7. A test layout according to claim 1, wherein the test layout is adapted for chip level testing.

8. A test layout according to claim 1, wherein the test layout is adapted for wafer level testing.

9. A test layout according to claim 1, wherein each of the plurality of conductive interconnects is identical.

10. A test layout according to claim 1, wherein each of the plurality of conductive interconnects is different.

11. A test layout according to claim 1, wherein some of the plurality of conductive interconnects are identical and some of the plurality of conductive interconnects are different.

12. A test layout for detecting electromigration comprising:
    multi-terminal devices wherein each device is one of a single-level and a multi-level interconnection structure on an integrated circuit, each device having at least a first terminal and a second terminal;
    an individual I+ pad coupled to the first terminal of each device;
    an individual V+ pad coupled to the first terminal of each device;
    at least one common I− pad coupled to the second terminal of each device;
    at least one common V− pad coupled to the second terminal of each device;
    means for applying a test signal to each device at the I+ and I− pads; and
    means for detecting the electromigration of each device at the V+ and V− pads in response to the applied test signal.

13. A test layout according to claim 12, wherein the test layout is adapted for wafer level testing.

14. A test layout according to claim 12, wherein the test layout is adapted for chip level testing.

15. A test layout according to claim 12, wherein each device is adapted to fail before any other component of the test layout.

16. A test layout for detecting metal extrusions of a plurality of devices, each of the plurality of devices including a multi-level conductive interconnect having a first terminal and a second terminal, the test layout comprising:
    an individual I+ pad connected by an individual conductor to the first terminal of each device;
    an individual V+ pad connected by an individual conductor to the first terminal of each device;
    at least one common I− pad connected by conductors to the second terminal of each device;
    at least one common V− pad connected by conductors to the second terminal of each device;
    at least one monitor adjacent to at least one of the plurality of devices for detecting metal extrusions of the at least one of the plurality of devices;
    wherein the conductors are adapted to fail before any other component of the test layout.

17. A method of testing multi-terminal devices each having a respective operating parameter, a first terminal, and a second terminal, the method comprising the steps of:

connecting the first terminal of each one of the multi-terminal devices to an individual I+ pad;

connecting the second terminal of each one of the multi-terminal devices to a common I− pad;

applying a current to each I+ pad; and detecting a voltage across each one of the multi-terminal devices until the respective operating parameter of each one of the multi-terminal devices exceeds a predetermined limit.

18. A test layout for detecting electromigration comprising:

a plurality of conductive interconnects, each having at least a first terminal and a second terminal;

an individual I+ pad coupled to the first terminal of each of the plurality of conductive interconnects;

at least one common I− pad coupled to the second terminal of each of the plurality of conductive interconnects;

means for applying a test signal to each of the plurality of conductive interconnects at the I+ and I− pads; and detecting means coupled to at least one of the first and second terminals of each of the plurality of conductive interconnects for detecting electromigration of the plurality of conductive interconnects, the detecting means including an individual V+ pad coupled to the first terminal of each of the plurality of conductive interconnects and at least one common V− pad coupled to the second terminal of each of the plurality of conductive interconnects.

19. A test layout according to claim 18, wherein the plurality of conductive interconnects are adapted to fail before any other component of the test layout by coupling each I+ pad and I− pad to each respective conductive interconnect using a conductor more robust than the respective conductive interconnect.

20. A test layout according to claim 18 further comprising:

at least one extrusion monitor adjacent to one of the plurality of conductive interconnects; and at least one common M pad coupled to the at least one extrusion monitor for detecting leakage current due to extrusion of the one of the plurality of conductive interconnects.

* * * * *